(12) United States Patent
Ruelke et al.

(10) Patent No.: US 8,415,257 B2
(45) Date of Patent: Apr. 9, 2013

(54) ENHANCED ADHESION OF PECVD CARBON ON DIELECTRIC MATERIALS BY PROVIDING AN ADHESION INTERFACE

(75) Inventors: Hartmut Ruelke, Dresden (DE); Volker Jaschke, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 163 days.

(21) Appl. No.: 12/898,822

(22) Filed: Oct. 6, 2010

(65) Prior Publication Data

US 2011/0104866 A1 May 5, 2011

(30) Foreign Application Priority Data

Oct. 30, 2009 (DE) .................. 10 2009 046 259

(51) Int. Cl.
*H01L 21/31* (2006.01)
*H01L 21/469* (2006.01)
(52) U.S. Cl.
USPC .......... 438/763; 438/421; 438/694; 438/942; 257/E21.486; 257/E21.573
(58) Field of Classification Search ............. 438/421, 438/694, 942, 763; 257/E21.486, E21.573
See application file for complete search history.

(56) References Cited

U.S. PATENT DOCUMENTS

| 6,143,666 | A | 11/2000 | Lin et al. |
| 2003/0186477 | A1 | 10/2003 | Bencher |
| 2004/0023475 | A1 | 2/2004 | Bonser et al. |
| 2007/0077751 | A1* | 4/2007 | Chen et al. ............ 438/622 |
| 2008/0171442 | A1* | 7/2008 | Wu et al. ............ 438/702 |
| 2008/0179281 | A1 | 7/2008 | Lee et al. |

OTHER PUBLICATIONS

Translation of Official Communication from German Patent Application No. 10 2009 046 259.7 dated Jul. 4, 2011.

* cited by examiner

*Primary Examiner* — Michelle Mandala
(74) *Attorney, Agent, or Firm* — Williams, Morgan & Amerson, P.C.

(57) ABSTRACT

Amorphous carbon material may be deposited with superior adhesion on dielectric materials, such as TEOS based silicon oxide materials, in complex semiconductor devices by applying a plasma treatment, such as an argon treatment and/or forming a thin adhesion layer based on silicon dioxide, carbon-doped silicon dioxide, prior to depositing the carbon material. Consequently, the hard mask concept based on amorphous carbon may be applied with an increased degree of flexibility, since a superior adhesion may allow a higher degree of flexibility in selecting appropriate deposition parameters for the carbon material.

18 Claims, 7 Drawing Sheets

ENHANCED ADHESION OF PECVD CARBON ON DIELECTRIC MATERIALS BY PROVIDING AN ADHESION INTERFACE

BACKGROUND OF THE INVENTION

1. Field of the Invention

Generally, the subject matter disclosed herein relates to integrated circuits, and, more particularly, to patterning processes requiring sophisticated hard mask material systems in microstructure devices.

2. Description of the Related Art

The fabrication of microstructures, such as integrated circuits, requires tiny regions of precisely controlled size to be formed in one or more material layers of an appropriate substrate, such as a silicon substrate, a silicon-on-insulator (SOI) substrate or other suitable carrier materials. These tiny regions of precisely controlled size are typically defined by patterning the material layer(s) by applying lithography, etch, implantation, deposition processes and the like, wherein, typically, at least in a certain stage of the patterning process, a mask layer may be formed over the material layer(s) to be treated to define these tiny regions. Generally, a mask layer may consist of or may be formed by means of a layer of photoresist that is patterned by a lithographic process, typically a photolithography process. During the photolithography process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etching, implantation, anneal processes and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of 50 nm and less for currently produced devices, with significantly reduced dimensions for device generations that are currently under development. Similarly, the line width of metal lines provided in the plurality of wiring levels or metallization layers may also have to be adapted to the reduced feature sizes in the device layer in order to account for the increased packing density. Consequently, the actual feature dimensions may be well below the wavelength of currently used light sources implemented in current lithography systems. For example, currently in critical lithography steps, an exposure wavelength of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well defined threshold so that weakly exposed areas may not substantially change at all, while areas having exceeded the threshold may exhibit a significant change of their chemical stability with respect to a subsequent development process.

On the other hand, the resist material has to provide high chemical stability with respect to wet chemical and plasma enhanced etch chemistries in order to efficiently transfer a pattern of the resist mask into the underlying material layer or layers. Consequently, the resist material has to be provided with a sufficient layer thickness for a given chemical resistivity with respect to the etch chemistry in order to withstand the etch attack until a desired etch time for patterning the underlying material layers is reached. With the introduction of short wavelengths, for instance 193 nm for currently-applied exposure tools, and with the prospect of even shorter wavelengths in the foreseeable future, the resist materials have to be adapted in the photochemical composition, while, at the same time, typically, a reduced layer thickness of the resist materials may be required in view of absorbing a sufficient amount of energy within the resist material in order to reliably exceed the threshold of the resist material. On the other hand, the ever-decreasing feature sizes of sophisticated microstructure devices may result in a reduction of depth of focus on the exposure tools in order to enhance the optical resolution of these devices. Consequently, any non-uniformities in the surface topography upon applying a resist material may increasingly influence the result of the exposure process, while, in addition, the required reduced thickness of the resist material may additionally impose an increased burden on the subsequent etch process, since the reduced resist thickness may no longer provide sufficient protection of covered materials for a plurality of complex patterning processes. Since performance and reliability of sophisticated microstructure devices, such as complex integrated circuits, may strongly depend on the high degree of fidelity in transferring mask features into the material systems of the semiconductor substrate, the further scaling of microstructure devices has resulted in an increasing employment of so-called hard mask materials. Generally, a hard mask material is to be understood as a material that may provide high etch resistivity with respect to an underlying material or material system, which may be provided with a reduced layer thickness that may be readily patterned on the basis of available resist systems of reduced layer thickness. Thus, in critical patterning processes, increasingly, a stack of layers, which may include at least a hard mask material and a resist material, may be formed on the material system that is actually to be patterned, and the resist mask obtained by sophisticated lithography techniques may be used for first patterning the hard mask material, which may then provide the required etch resistivity during the further patterning of the underlying material system. In addition, frequently, the hard mask material, or at least a portion thereof, may also be used as an anti-reflective coating (ARC) material in order to reduce a back reflection of the incoming exposure energy.

Although the concept of hard mask materials may provide superior patterning results in sophisticated process strategies, this concept may be associated with several drawbacks, which may also strongly affect the patterning sequence for critical device features. For example, typical hard mask materials may be silicon nitride, silicon dioxide, silicon oxynitride and the like, since these materials are well established in semiconductor fabrication strategies and also these materials may be available for a plurality of sophisticated etch recipes in order to remove other materials selectively with respect to the hard mask material. On the other hand, these hard mask materials may have to be removed after the patterning process selectively with respect to the underlying material system, which may require a moderately high etch selectivity of the hard mask material with respect to the underlying material system, which may thus significantly restrict the applicability of the hard mask concept in critical patterning processes. Otherwise, the removal of the hard mask may have a significant influence on the finally-obtained patterning result.

In view of this situation, carbon has been considered as a viable hard mask material, since carbon has a high etch resistivity for a plurality of well-established etch recipes and may thus provide a desired high etch selectivity for a plurality of materials that are used in semiconductor fabrication processes. On the other side, carbon may be removed very efficiently by an oxygen plasma, as may also be used for resist stripping, thereby enabling the removal of the carbon material from any patterned material systems substantially without negatively affecting the underlying structure. Carbon material, for instance in the form of diamond-like carbon, may be applied by a plurality of deposition techniques, such as sputter deposition, chemical vapor deposition (CVD) and the like. In some of these deposition techniques, the carbon material may be provided with a high internal stress level, which may be considered inappropriate for a plurality of applications. Furthermore, plasma enhanced CVD techniques have been developed, in which an amorphous carbon material may be efficiently deposited on materials based on a plurality of precursor materials. For instance, many types of hydrocarbons may be used as a precursor material in combination with additional gases, such as noble gases, hydrogen and the like, thereby enabling desired high deposition rates and uniformity of the amorphous carbon material. Thus, amorphous carbon material formed on the basis of plasma enhanced CVD techniques represents a promising material for sophisticated patterning processes, possibly in combination with an overlying dielectric ARC material, which may be used for a plurality of critical patterning processes, such as the patterning of isolation trenches, gate electrode structures, contact openings in the contact level of semiconductor devices, via openings and trenches in metallization systems of complex semiconductor devices and the like.

In sophisticated patterning processes based on an amorphous carbon hard mask material, contamination problems associated with the patterning process have recently been observed, which are assumed to be caused by a reduced adhesion of the carbon material, as will be explained with reference to FIGS. 1a-1b.

FIG. 1a schematically illustrates a microstructure device, such as a semiconductor device 100, in a manufacturing stage in which a material layer 102 or a material layer system may be provided above a substrate 101, such as a semiconductor material, an insulating material and the like, and has to be patterned so as to obtain device features having lateral dimensions of several hundred nanometers to tens of nanometers, depending on corresponding design rules. Thus, for instance, an opening has to be formed in the material layer 102 having a critical width as specified before and/or corresponding material regions have to be preserved, which may have a critical dimension in the above-specified range. Frequently, the material layer 102, or at least a portion thereof, may comprise a dielectric material formed on the basis of a silicon oxide material, since silicon and corresponding oxides represent well-established and frequently-used materials in the fabrication of microstructure devices. As is well known, silicon dioxide may be formed on the basis of plasma enhanced or thermally activated CVD techniques by using various precursor materials, wherein one frequently applied material is TEOS (tetraethyl orthosilicate) which may impart certain desired characteristics to the resulting silicon dioxide material. In the material layer 102 or material layer system as shown in FIG. 1a, at least an upper portion may be comprised of silicon dioxide material that is formed on the basis of TEOS. Furthermore, an amorphous carbon layer 103 is formed on the material layer 102 with a thickness of, for example, 20-60 nm. If required, a dielectric ARC layer 104, such as a silicon dioxide layer, a silicon oxynitride layer and the like, may be provided above the hard mask material 103 with a thickness of approximately 10-20 nm, depending on the optical requirements for obtaining a desired low back reflection of the entire layer stack. Furthermore, a resist mask 105 is formed above the layers 103, 104 with a thickness so as to comply with the optical requirements and provide sufficient etch resistivity for the patterning of at least the layer 104, if provided, or the layer 103. Furthermore, a mask feature, such as an opening 105A having critical dimensions as required for patterning the layer 102 is formed in the resist mask 105.

The device 100 as illustrated in FIG. 1a may be formed on the basis of well-established process techniques. That is, the layer or layer system 102 may be formed by any appropriate deposition technique, followed by a plasma enhanced CVD process for forming the amorphous carbon material 103. During the plasma enhanced deposition process, any appropriate hydrocarbon gas is supplied to the process chamber, in which a plasma may be established, for instance, on the basis of hydrogen, nitrogen, ammonia and the like. Based on appropriate process parameters, such as high frequency power, pressure and, in particular, temperature of the device 100, the layer 103 may be deposited. The selection of appropriate process parameters of the plasma enhanced CVD process may have a strong influence on the finally-obtained mechanical characteristics of the layer 103, for instance in view of adhesion to the underlying material 102. For this purpose, typically, the gas flow rate of any additional gases, generally the mixture of the various gas components, the high frequency power and, in particular, the temperature may be selected so as to obtain a high adhesion of the material 103 on the material system 102. On the other hand, many of these process parameters, such as high frequency power and temperature, may frequently not be selected independently from the specific application, since, for instance, sensitive device areas may require a restriction of one or more of these parameters. For instance, the temperature during the deposition process may not be selected above approximately 500° C., if the material layer 102 to be patterned represents a portion of a contact level or metallization system of the device 100, since any such high temperatures may negatively affect other sensitive materials, such as metal silicide regions (not shown) and the like. In other cases, an increased high frequency power may not be compatible with sensitive structures of the device 100, for instance in view of plasma damage and the like. Consequently, the process parameters used for applying the amorphous carbon material 103 may frequently represent a compromise between mechanical characteristics of the material 103 and acceptable parameter values. Thereafter, if required, the ARC material 104 may be formed on the basis of well-established process techniques, followed by the application of a resist material and a subsequent lithography process for obtaining the critical mask feature 105A.

FIG. 1b schematically illustrates the device 100 during an etch process 106 that is designed to transfer the critical mask feature 105A into the hard mask layer 103, thereby forming the feature 103A therein. As previously discussed, during the etch process 106, a significant portion of the resist material 105 may also be consumed, wherein, nevertheless, sufficient protection of covered areas of the carbon material 103 may be ensured by appropriately adapting the resist thickness. If the ARC material 104 may be provided, a very thin resist layer may be used, since in this case the resist material may have a high etch selectivity with respect to the material 104, which may then reliably protect the carbon material 103, when etched on the basis of an oxygen plasma, during which the remaining resist material may also be consumed.

Thereafter, the material system 102 may be etched on the basis of any appropriate etch chemistry, while the hard mask 103 including the mask feature 103A may provide the desired high etch resistivity. After the critical etch process, the carbon material 103 may be efficiently removed on the basis of an oxygen plasma, substantially without affecting the material 102. It has been recognized, however, that, during the various process steps, i.e., during the lithography process for patterning the resist material 105 and during the subsequent patterning of the carbon material 103, the adhesion of the material 103 to the material 102 may be insufficient, thereby causing the delamination of carbon material, which may thus result in a potential yield loss. Since the adaptation of the mechanical characteristics of the carbon material 103 may be difficult to be achieved on the basis of the process parameters of the plasma enhanced deposition process, the applicability of the per se very advantageous amorphous carbon material in critical patterning sequences may be associated with a high risk of significantly reducing production yield.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques for forming a carbon hard mask material on dielectric material systems with superior adhesion by applying a preceding plasma treatment based on an inert gas species and/or by forming a thin additional adhesion layer in the form of a silane-based oxide material or a carbon-doped oxide material. It has been recognized that the mechanical characteristics of an interface between a dielectric material, and in particular a silicon oxide based material formed on the basis of TEOS, and a carbon material may be significantly enhanced by performing a plasma treatment prior to the deposition of the carbon material, which may result in superior flexibility in adjusting other process parameters of the plasma enhanced CVD process for forming the carbon material. Alternatively or additionally to the plasma treatment, a thin adhesion layer, for instance with a thickness of approximately 3-10 nm, may be formed, for instance, on the basis of a silicon dioxide material applied by plasma enhanced CVD on the basis of silane, or as a carbon-doped silicon oxide material, prior to depositing the carbon material, thereby also obtaining superior mechanical stability of the entire hard mask material system. In some illustrative embodiments disclosed herein, the adhesion layer may be treated by a plasma prior to the deposition of the amorphous carbon material, thereby obtaining even further enhanced mechanical stability for a wide variety of process parameter values, such as temperature, during the deposition of the amorphous carbon material.

One illustrative method disclosed herein comprises exposing a dielectric material layer of a semiconductor device to a plasma ambient established in an inert gas, wherein the dielectric material is formed on the basis of TEOS. The method further comprises forming a carbon layer above the dielectric material layer by performing a plasma enhanced chemical vapor deposition process. Additionally, a resist mask is formed above the carbon layer and the carbon layer is patterned by using the resist mask so as to form a hard mask. Additionally, the method comprises patterning the dielectric material layer by using the hard mask as an etch mask.

Another illustrative method disclosed herein relates to forming a carbon-containing hard mask in a semiconductor device. The method comprises forming an adhesion layer on a dielectric material layer to be patterned on the basis of a first plasma enhanced chemical vapor deposition process using a silane precursor gas and/or a carbon and silicon-containing precursor gas. The method further comprises forming a carbon layer on the adhesion layer by performing a second plasma enhanced chemical vapor deposition process. Furthermore, an opening is formed in the carbon layer by using a resist mask. Additionally, the method comprises etching the dielectric material layer by using the carbon layer including the opening as an etch mask.

A further illustrative method disclosed herein relates to forming a hard mask in a semiconductor device. The method comprises forming a silane-based material layer or a carbon-doped oxide layer as an adhesion layer on a dielectric material layer to be patterned by performing a plasma enhanced chemical vapor deposition process. The method further comprises exposing the adhesion layer to a plasma ambient that is established in an inert gas atmosphere. Moreover, a carbon layer is formed on the adhesion layer after exposure to the plasma ambient. The method additionally comprises patterning the carbon layer by using a resist mask so as to form the hard mask.

BRIEF DESCRIPTION OF THE DRAWINGS

The disclosure may be understood by reference to the following description taken in conjunction with the accompanying drawings, in which like reference numerals identify like elements, and in which.

Figure 1A:
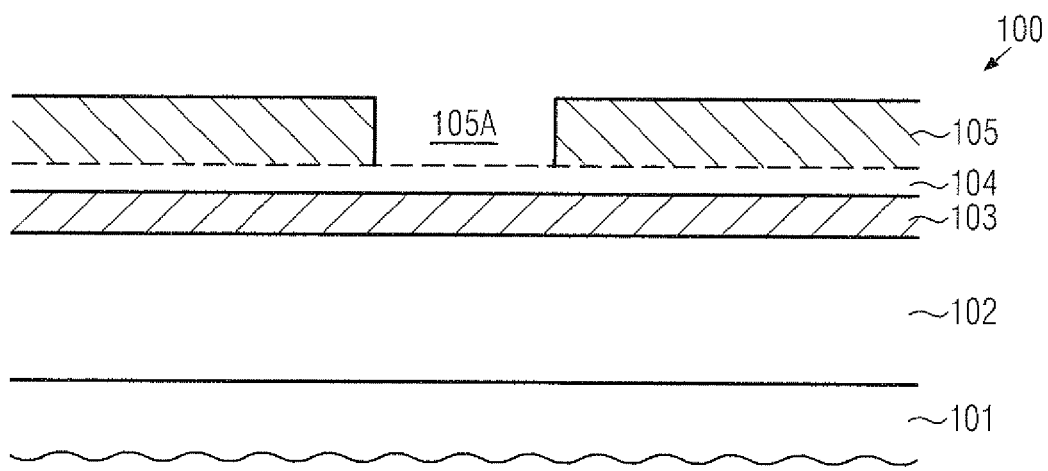
FIGS. 1a-1b schematically illustrate cross-sectional views of a semiconductor device during various manufacturing stages in forming a carbon hard mask, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques for forming a carbon-based hard mask material or material system on a dielectric layer of microstructure devices, such as semiconductor devices, wherein an adhesion layer and/or a plasma treatment may significantly increase the adhesion of the cover material to the underlying material. It has been recognized that, in particular, the adhesion of amorphous carbon material provided by plasma enhanced CVD on dielectric materials, in particular on silicon dioxide based materials formed by plasma enhanced CVD or sub-atmospheric CVD using TEOS as a precursor material, may be reduced and may not be compatible with sophisticated patterning strategies, since an increased probability of material delamination may exist during the sophisticated lithography and patterning process. Since these materials may frequently be encountered, at least as surface layers, of material systems to be patterned in sophisticated semiconductor devices or any type of microstructure devices, the per se advantageous employment of amorphous carbon material as a hard mask material may be significantly restricted, since a variation of process parameters may not result in a required degree of adhesion for many of these sophisticated patterning processes, and also respective required parameters may not be compatible with other requirements, such as deposition rate, thermal budget, risk of plasma-induced damage and the like. By applying a plasma treatment, such as a plasma based on argon, or by providing a thin adhesion layer resulting in superior adhesion of the carbon material thereon, or by a combination of these two measures, i.e., forming an adhesion layer and treating the adhesion layer with plasma treatment prior to the deposition of the amorphous carbon material, enhanced adhesion may be obtained for a given process window of process parameters of the plasma enhanced CVD process for depositing the amorphous carbon material. On the other hand, a plasma treatment may be readily implemented into the overall process flow without adding to process complexity, for instance, by performing the plasma treatment in situ with the subsequent deposition of the amorphous material. Similarly, the deposition of a thin adhesion layer, for instance having a thickness of 3-10 nm, may not unduly affect the overall process sequence, wherein the adhesion layer may be removed, if required, upon removal of the carbon hard mask without unduly affecting any underlying material systems.

Figure 1B:
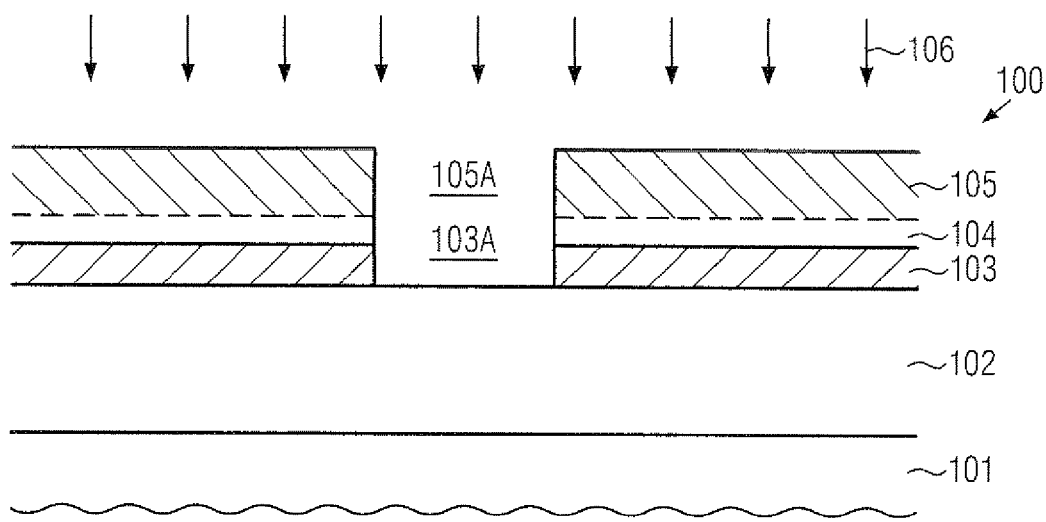

With reference to FIGS. 2a-2h, further illustrative embodiments will now be described in more detail, wherein reference may also be made to FIGS. 1a-1b, if appropriate.

Figure 2A:
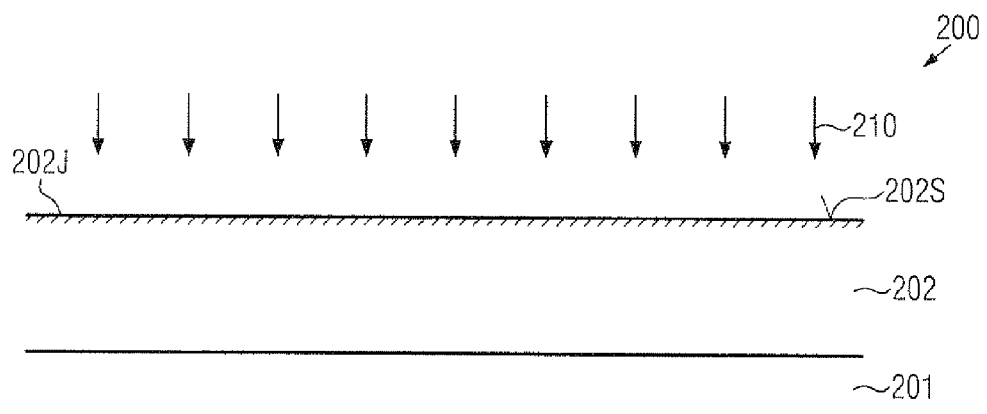
FIGS. 2a-2b schematically illustrate cross-sectional views of a microstructure device during different manufacturing stages in forming a carbon material layer on a dielectric material layer to be patterned on the basis of the carbon material, wherein an argon plasma treatment may be applied, according to illustrative embodiments.

FIG. 2a schematically illustrates a microstructure device 200, such as a complex semiconductor device and the like, which may comprise a substrate 201 in and above which may be formed device features, such as circuit elements in the form of transistors, resistors, capacitors and the like. For convenience, any such device features are not shown. In other cases, as will be described later on in more detail, the substrate 201 may comprise a semiconductor material to be patterned, for instance, for providing isolation trenches, capacitors and the like. Moreover, a material layer 202 may be formed above the substrate 201 and may represent any material system that is to be patterned in order to obtain device features, which may have critical dimensions of several tens of nanometers, such as gate electrode structures of sophisticated field effect transistors, contact openings and the like. In some illustrative embodiments, the dielectric layer 202 may comprise, at least at a surface 202S thereof, well-established dielectric materials, for instance, silicon dioxide based materials, which may have specific material characteristics as are obtained when forming the dielectric layer 202 or at least a surface area thereof by plasma enhanced CVD on the basis of TEOS. In other cases, the layer 202 may be, at least partially, formed on the basis of sub-atmospheric CVD, which is to be understood as a thermally activated CVD process which is performed at moderately high pressures, such as several hundred Torr, thereby obtaining specific characteristics, such as superior mechanical integrity, high gap-fill capability of the deposition process and the like. For instance, a silicon dioxide material formed on the basis of sub-atmospheric CVD may frequently be applied as a dielectric material of contact levels of semiconductor devices in order to enclose and passivate semiconductor-based circuit elements, such as transistors, resistors and the like.

As previously discussed with reference to the device 100, on forming an amorphous carbon hard mask material on a plurality of dielectric materials, such as the layer 202, inferior adhesion may occur, which may result in yield losses in the subsequent patterning process. For this purpose, in one illustrative embodiment, the surface 202S may be exposed to a plasma ambient in order to perform a surface treatment 210, which may result in superior adhesion of a subsequently-deposited amorphous carbon material. Although the exact mechanism is not yet understood, the treatment 210 may result in a modified interface 202J, caused by the interaction of the plasma particles with the surface 202S. In one illustrative embodiment, the plasma ambient 210 may be established on the basis of an inert gas species, such as argon, on the basis of the following process parameters.

The pressure during the plasma treatment 210 may be adjusted to approximately 3-8 Torr, for instance approximately 5.5 Torr. The temperature of the substrate 201 and thus of the surface 202S may be adjusted to approximately 300-500° C., for instance approximately 400° C. In any appropriate process tools that are configured to establish the plasma ambient 210, such as deposition tools used for a plasma enhanced deposition process, which may enable the processing of 300 mm substrates, the high frequency power, i.e., the power for establishing the plasma, may be adjusted to approximately 300-700 Watt, for instance approximately 500 Watt. Furthermore, the spacing of the substrate 201 with respect to a corresponding gas supply, such as a showerhead as is typically used in available deposition tools, may be adjusted to approximately 500-1500 mils, for example 1000 mils. Furthermore, the gas flow rate, such as the argon flow rate, may be in the range of 500-1500 sccm, for instance approximately 1000 sccm. In this case, a duration of the treatment may be adjusted to approximately 20-90 seconds, for instance approximately 30 seconds.

It should be appreciated that some of the above-specified process parameters, such as flow rates, high frequency power, distance of the substrate from the showerhead and the like, may depend on the specific configuration of the deposition tool used. It should be appreciated, however, that, based on the above-specified parameter values, appropriate process parameters for any deposition tool may be readily determined by performing experiments and the like.

Figure 2B:
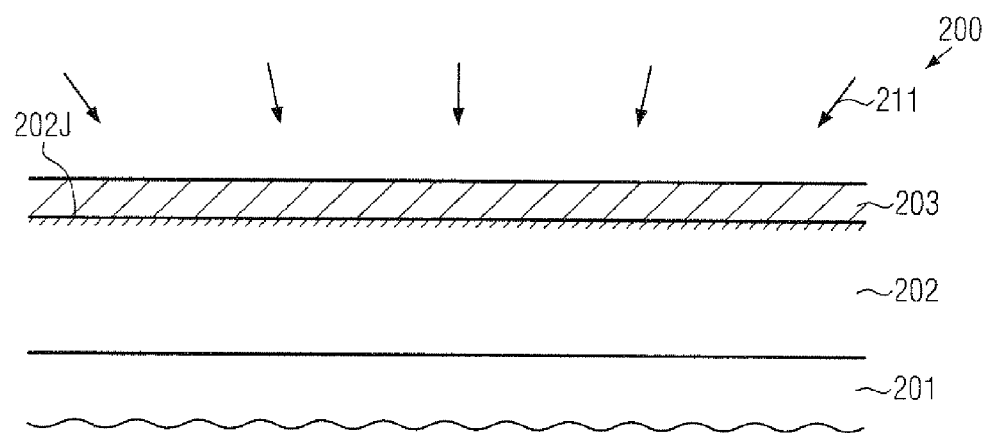

FIG. 2b schematically illustrates the microstructure device 200 in a further advanced manufacturing stage in which a plasma enhanced deposition process 211 may be performed so as to deposit a carbon hard mask material layer 203. The material layer 203 may be provided with any required thickness, corresponding to the etch selectivity of the material 203 with respect to the dielectric layer 202 for a given etch recipe. For instance, typically a thickness of approximately 10 to 100 nm may be sufficient, while, in other cases, even several 100 nanometers may be used as a thickness for the material layer 203. During the plasma enhanced deposition process 211, appropriate hydrocarbon gases, for instance using the general formula $C_xH_y$, may be supplied to the process chamber, possibly in combination with additional gases, such as hydrogen, nitrogen, ammonia, argon, helium and the like, thereby enabling adjustment of density and deposition rate for the material layer 203. For example, for a deposition tool employed to process 300 mm substrates, flow rates of 200-700 sccm for any additional gases may be applied. On the other hand, the carbon-containing precursor species may be supplied with flow rates of approximately 200-2000 sccm, while a high frequency power may be adjusted to several 100 Watts to 1000 Watts and higher, while a pressure may be selected to several Torr. Furthermore, a temperature of the substrate 201 may be selected to be approximately 200-500° C., depending on other requirements, such as deposition rates and the like. Due to the subsequent plasma treatment 210 (FIG. 2a), superior adhesion of the material layer 203 on dielectric material layer 202 via the modified interface 202J may be accomplished. For example, the adhesion characteristics may be efficiently determined on the basis of a MELT (modified edge liftoff test), in which standardized measurement procedures have been implemented. Based on these measurement procedures, it has been determined for otherwise identical process conditions, an increase of adhesion of approximately 15% and higher for a process temperature of approximately 400° C. during the deposition process 211 when forming the carbon material 203, on the basis of the enhanced interface 202J, compared to conventional process strategies without a preceding plasma treatment. In some illustrative embodiments, the treatment 210 (FIG. 2a) and the deposition process 211 may be performed in the same process tool, thereby accomplishing an in situ process sequence, which may therefore result in a high efficiency of the plasma treatment, since any undue exposure to the clean room ambient may be avoided, while also any additional substrate transport and handling activities may be avoided.

Consequently, the processing of the device 200 may be continued by applying a resist material, possibly in combination with additional ARC material, so as to efficiently pattern the material 203, which may then be used as an etch mask for patterning the material 202, as will also be described later on in more detail.

Figure 2C:
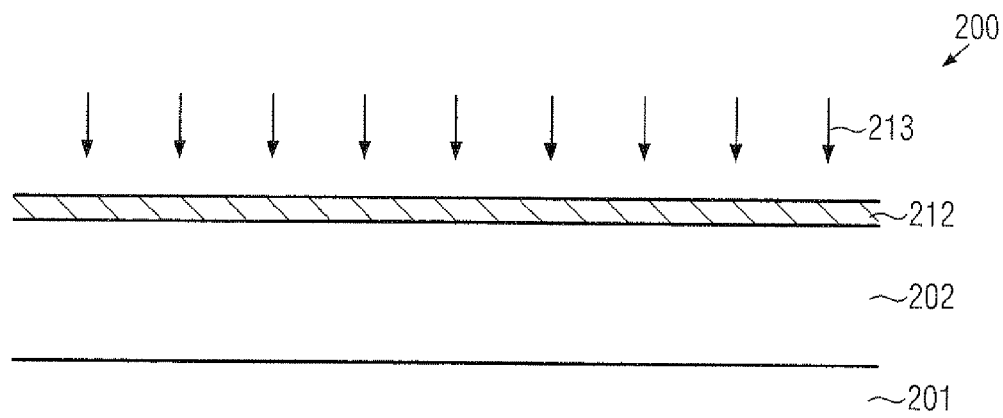
FIGS. 2c-2d schematically illustrate cross-sectional views of the microstructure device when forming a carbon hard mask material layer on the basis of a thin adhesion layer, according to illustrative embodiments.

FIG. 2c schematically illustrates the device 200 according to further illustrative embodiments, in which adhesion of a carbon material may be enhanced by providing a thin adhesion layer 212 on the dielectric material 202 with a thickness of several nanometers, such as approximately 3-10 nm. In one illustrative embodiment, the adhesion layer 212 may be provided as a silicon dioxide based material, which may be formed by a plasma enhanced CVD process 213 based on a silane precursor material. Consequently, by providing the adhesion layer 212 with a reduced thickness, the dielectric material 202 may be endowed with "surface characteristics" in view of the subsequent deposition of the carbon material. As is well known, silicon dioxide material formed on the basis of silane in a plasma enhanced CVD process may have different characteristics compared to a silicon dioxide material formed on the basis of TEOS. For instance, the deposition process 213 may be formed with the following process parameters for a deposition tool that is configured to process 300 mm substrates.

The pressure in the deposition atmosphere may be selected to be approximately 2-6 Torr, for instance approximately 3 Torr. The temperature of the device 200 and thus of the dielectric material 202 may be adjusted to be approximately 350-500° C., for instance approximately 480° C. The high frequency power for establishing the plasma may be adjusted to be approximately 300-600 Watt, for instance approximately 450 Watt. The spacing of the device 200 within the process chamber may be adjusted to be approximately 300-600 mils, for instance approximately 480 mils. The silane flow rate may be adjusted to be approximately 40-120 sccm, for instance approximately 80 sccm. The flow rate of nitrogen oxide ($N_2O$), which may be used as an additional gas component, may be adjusted to be approximately 4000-12000 sccm, for instance approximately 8000 sccm. Furthermore, a deposition rate may be approximately 60-80 nm per minute, for instance approximately 70 nm per minute. As explained before, these parameter values may be readily adapted to any desired deposition tool so as to obtain the adhesion layer 212 with the desired characteristics.

Figure 2D:
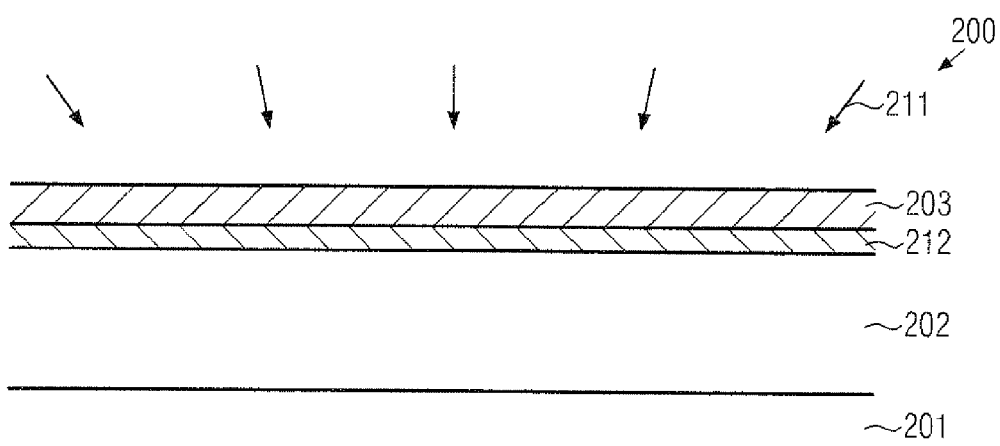

FIG. 2d schematically illustrates the device 200 with the carbon layer 203 formed on the adhesion layer 212 by performing a plasma enhanced CVD process, such as the process 211, as previously described with reference to FIG. 2b.

Consequently, also in this case, superior adhesion may be achieved, wherein, compared to a conventional strategy, i.e., the provision of the material 203 without the intermediate adhesion layer 212 and without a plasma treatment, an increase of adhesion of 15-20% may be obtained under the standard MELT conditions, when the material 203 may be deposited during the process 211 at a temperature of approximately 400° C.

In other illustrative embodiments, the adhesion layer 212 may be provided in the form of a carbon-doped oxide layer, which may be accomplished by including a carbon-containing precursor material into the deposition ambient of, for instance, the process 211. In other illustrative embodiments, a desired degree of carbon concentration, for instance approximately 0.5-5 atomic percent, may be incorporated into the base material of the adhesion layer 212 in the form of silicon dioxide by implantation, plasma treatment and the like.

Figure 2E:
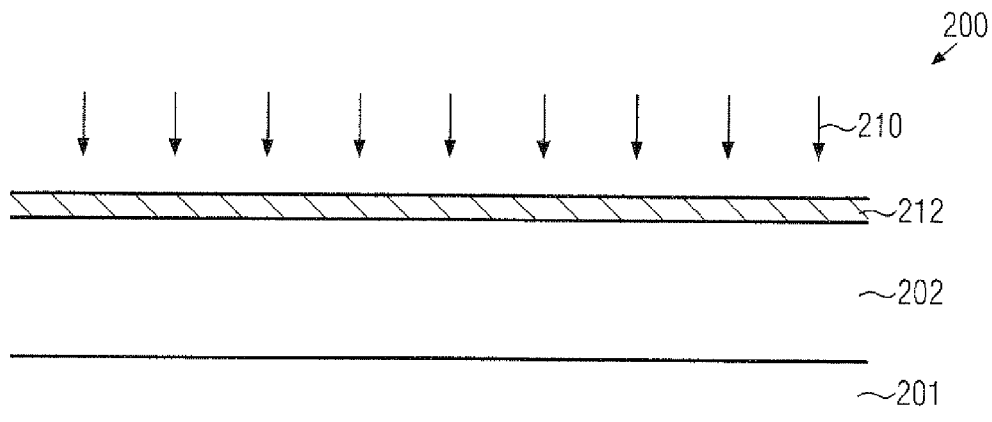
FIGS. 2e-2g schematically illustrate cross-sectional views of the microstructure device during various manufacturing stages in forming a carbon-based hard mask by applying a thin adhesion layer in combination with a plasma treatment, according to other illustrative embodiments.

FIG. 2e schematically illustrates the device 200 according to further illustrative embodiments, in which the adhesion layer 212, for instance in the form of a silicon oxide material formed by a silane precursor material, may additionally be exposed to a plasma treatment, such as the treatment 210, as previously explained with reference to FIG. 2a. Consequently, the surface characteristics of the layer 212 may additionally be altered and may result in an even further increase of the adhesion characteristics of the amorphous carbon material to be formed on the modified adhesion layer 212.

Figure 2F:
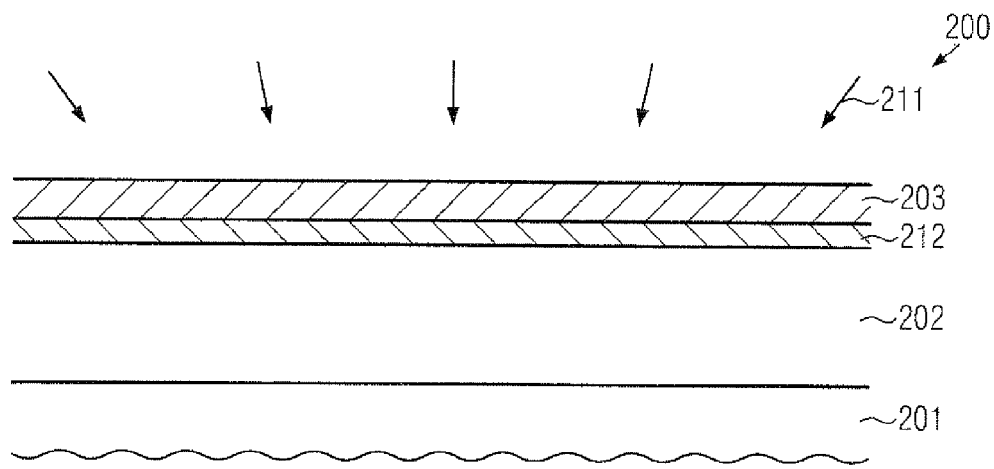

FIG. 2f schematically illustrates the device 200 during the deposition process 211 for forming the carbon material 203 on the adhesion layer 212, which has been treated by a plasma ambient. It should be appreciated that, for the deposition process 211 and the plasma treatment, the same criteria may apply as previously discussed with reference to FIGS. 2a-2b. Thereafter, any further material layers, if required, may be formed, such as an ARC material, in the form of silicon oxide, silicon oxynitride and the like, wherein any appropriate deposition techniques may be applied.

Figure 2G:
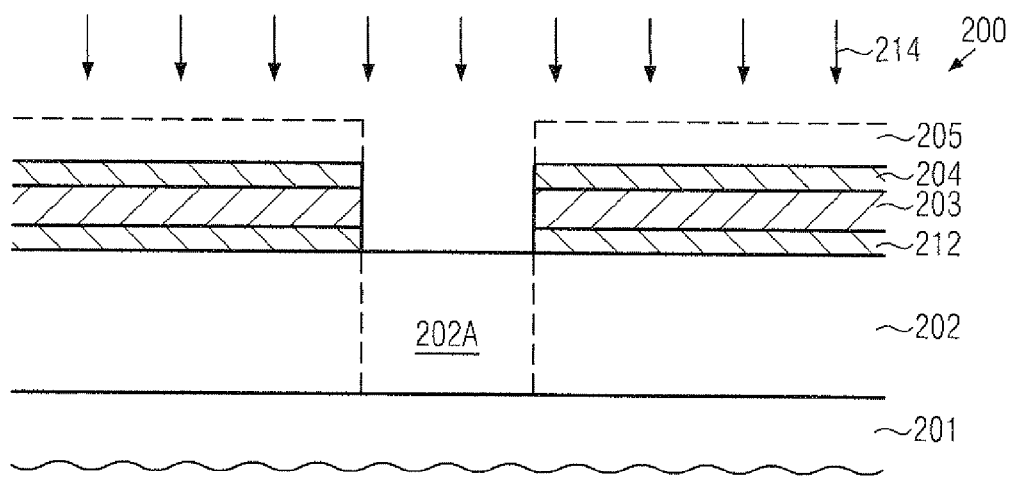

FIG. 2g schematically illustrates the device 200 in a further advanced manufacturing stage. As illustrated, the device 200 may be exposed to an etch ambient 214 that is configured to remove the material 202 selectively with respect to at least the hard mask material 203. In the embodiment shown, additionally, a dielectric ARC material 204 may be provided, which may be consumed during the process 214. Furthermore, a resist mask 205 may be provided so as to pattern the layer 204, if required, and/or the hard mask material 203, depending on the overall process strategy. For instance, the resist mask 205 may be provided on the basis of sophisticated lithography techniques and may be used to pattern the layer 204, which additionally may provide sufficient etch stop capabilities when etching the hard mask material 203, for instance on the basis of an oxygen plasma, which may also consume the resist mask 205. Thereafter, the adhesion layer 212, if provided, may be patterned on the basis of the process 214 and finally the material 202 may be etched based on the mask 203 in order to obtain a device feature, such as an opening 202A and the like, having the required critical dimensions.

Thus, during the entire process sequence for applying carbon material 203, patterning the same and etching the dielectric material 202, the superior adhesion of the material 203 may provide reduced yield losses and an increased flexibility in selecting appropriate process parameters for forming the carbon material 203. For example, the adhesion of the material system 212 and 203 in combination with a plasma treatment, such as the treatment 210 as described in FIG. 2e, may result in an increase of adhesion, for instance, measured on the basis of the MELT procedure, of approximately 20-30% and higher compared to conventional strategies without the adhesion layer 212 and without a plasma treatment for process temperatures of the carbon material between 300-400° C. Consequently, critical device features may be efficiently formed on the basis of an amorphous carbon hard mask material, while providing a superior process window in view of depositing the carbon material.

With reference to FIGS. 2h-2k, further device features will be described which may be advantageously formed on the basis of a carbon hard mask material that is formed on the basis of any of the embodiments described above.

Figure 2H:
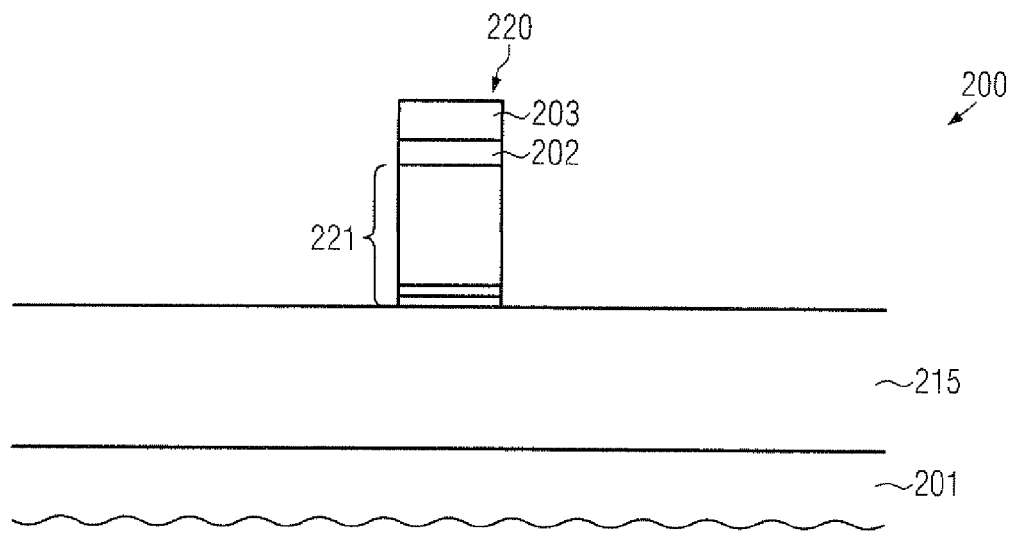
FIGS. 2h-2k schematically illustrate cross-sectional views of a microstructure device in various manufacturing stages, in which a carbon hard mask formed in accordance with the principles disclosed herein may be applied for patterning device features, according to still further illustrative embodiments.

FIG. 2h schematically illustrates the device 200 in a manufacturing stage in which a gate electrode structure 220 of a field effect transistor may be formed above a semiconductor layer 215. The gate electrode structure 220 may comprise a gate layer stack 221 comprising various material layers as required, such as gate dielectrics, electrode materials and the like. Furthermore, the dielectric material 202 which may be formed above the layer stack 221 may comprise any appropriate material, wherein at least the surface thereof may result in a reduced adhesion, as explained above. Furthermore, carbon layer 203 may be formed above dielectric layer 202, possibly in combination with an adhesion layer (not shown), wherein the carbon material 203 may be provided on the basis of any of the above-described concepts, i.e., by using a plasma treatment and/or by applying an adhesion layer. Consequently, the gate electrode structure 220 may be patterned on the basis of the material 203 having a superior adhesion to the underlying material 202.

Figure 2I:
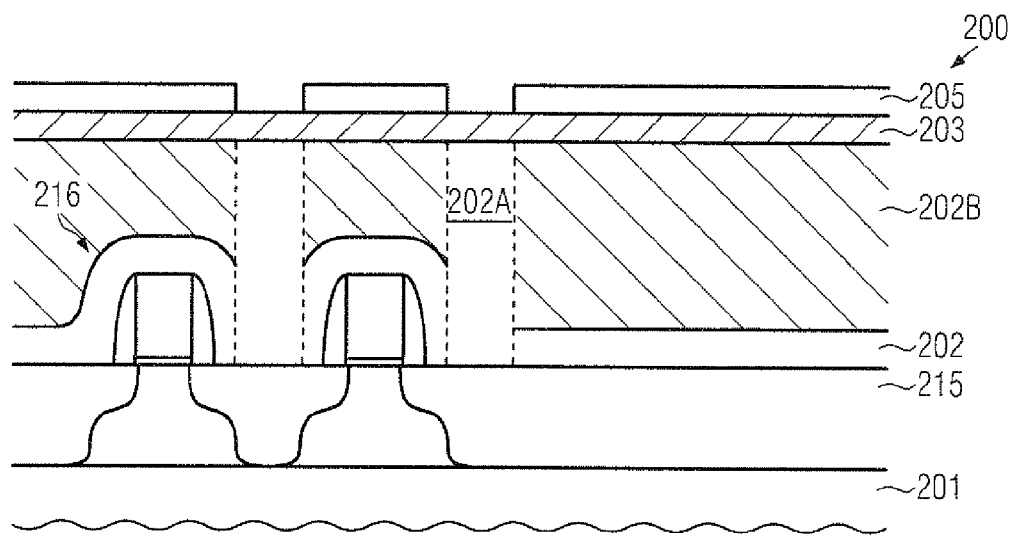

FIG. 2i schematically illustrates the device 200 in a further advanced manufacturing stage in which the dielectric material 202 may be provided as a interlayer dielectric material of a contact level, which may thus enclose and passivate circuit elements 216, such as field effect transistors, which may be formed in and above the semiconductor layer 215. The interlayer dielectric material 202 may comprise additional materials, such as a contact etch stop layer 202B and the like. Also in this case, the carbon hard mask material layer 203 may be provided with superior adhesion based on any of the concepts disclosed above. Consequently, corresponding contact openings 202A may be formed within the materials 202, 202B on the basis of a resist mask 205, which may be used to pattern the hard mask material 203, for instance in combination with an additional ARC material, as discussed above.

Figure 2J:
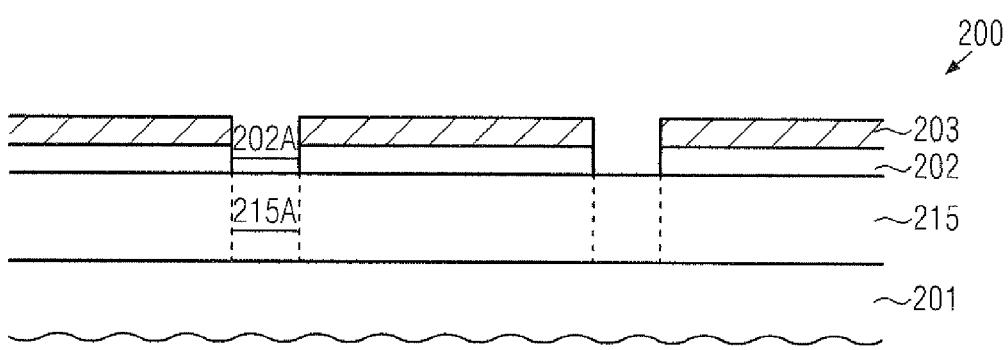

FIG. 2j schematically illustrates the device 200 in an early manufacturing stage in which openings 215A, such as isolation trenches, may have to be formed in the semiconductor layer 215. Typically, dielectric material 202 may be formed on or above the semiconductor layer 215 and may have to be patterned so as to form the openings 202A therein, which may also be accomplished on the basis of the hard mask 203, which may be formed in accordance with the above-described principles.

Figure 2K:
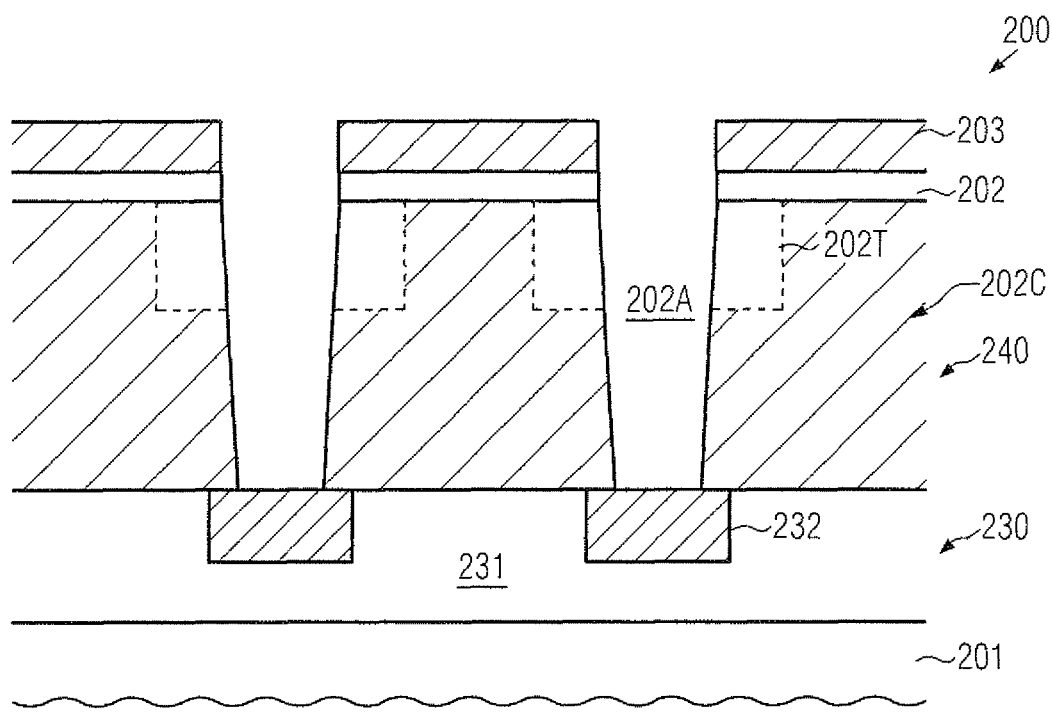

FIG. 2k schematically illustrates the microstructure device 200 with a plurality of metallization layers 230, 240 provided above the substrate 201. The metallization layer 230 may comprise a dielectric material 231 and metal lines 232 formed therein. The metallization layer 240 may comprise any appropriate dielectric material 202C, which may result in inferior adhesion of an amorphous carbon material or the material 202C may have a surface layer 202 having characteristics as described before. Furthermore, also in this case, the carbon hard mask material 203 may be provided so as to have enhanced adhesion compared to conventional strategies, by applying any of the above-described embodiments. Consequently, the hard mask 203 may be advantageously used to form contact openings 202A, which may finally connect to the metal lines 232. Furthermore, in a subsequent patterning process, corresponding trenches 202T may be formed within the materials 202, 202C on the basis of an amorphous carbon material that may be provided in accordance with the principles disclosed above.

As a result, the present disclosure provides techniques for enhancing adhesion of an amorphous carbon material to be formed on a dielectric material by performing a plasma treatment or forming a thin adhesion layer, possibly in combination with a subsequent plasma treatment, prior to the plasma enhanced CVD process for forming the amorphous carbon material. Thus, an increased flexibility in selecting appropriate process parameters for providing the carbon hard mask material may be accomplished, which may, therefore, contribute to enhanced flexibility in applying the carbon hard mask concept to various manufacturing stages in forming complex microstructure devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dielectric material layer of a microstructure device using a TEOS (tetraethyl ortho silicate) precursor gas;
    after forming said dielectric material layer, establishing a plasma ambient in an inert gas atmosphere and exposing a surface of said dielectric material to said plasma ambient;
    forming a carbon layer above said dielectric material layer by performing a plasma enhanced chemical vapor deposition process;
    forming a resist mask above said carbon layer;
    patterning said carbon layer by using said resist mask so as to form a hard mask; and
    patterning said dielectric material layer by using said hard mask as an etch mask.

2. The method of claim 1, wherein said plasma ambient is established by using argon as said inert gas.

3. The method of claim 1, wherein exposing said dielectric material layer to said plasma ambient and forming said carbon layer are performed as an in situ process.

4. The method of claim 1, wherein said carbon layer is formed on said dielectric material layer.

5. The method of claim 1, further comprising forming said dielectric material layer using said TEOS precursor gas in a plasma enhanced chemical vapor deposition process.

6. The method of claim 1, further comprising forming said dielectric material layer using said TEOS precursor gas in a sub-atmospheric chemical vapor deposition process.

7. The method of claim 1, wherein a temperature of said dielectric layer is adjusted to be approximately 350-450° C.

8. The method of claim 1, further comprising forming one of an isolation trench, a gate electrode structure, a contact opening and a via opening in a dielectric material of a metallization system and a trench in said dielectric material of said metallization system by using said patterned dielectric material layer.

9. The method of claim 1, wherein establishing said plasma ambient comprises adjusting a temperature of said dielectric material layer to be approximately 300-500° C. and a pressure of said plasma ambient to be approximately 3-8 Torr.

10. A method of forming a hard mask in a microstructure device, the method comprising:
    forming a dielectric material layer to be patterned using a TEOS precursor gas;
    forming one of a silane-based material layer and a carbon-doped oxide layer as an adhesion layer on said dielectric material layer to be patterned by performing a plasma enhanced chemical vapor deposition process;
    after forming said adhesion layer, exposing said adhesion layer to a plasma ambient established in an inert gas atmosphere;
    forming a carbon layer on said adhesion layer after exposing said adhesion layer to said plasma ambient; and
    patterning said carbon layer by using a resist mask so as to form said hard mask.

11. The method of claim 10, wherein said inert gas atmosphere is established by using argon as an inert gas.

12. The method of claim 10, wherein exposing said adhesion layer to said plasma ambient and forming said carbon layer are performed as an in situ process.

13. A method, comprising:
    performing a first chemical vapor deposition using a TEOS precursor gas to form an interlayer dielectric material comprising silicon dioxide above a semiconductor substrate of a semiconductor device;
    after forming said interlayer dielectric material, establishing a plasma ambient in an inert atmosphere and exposing said semiconductor device to said plasma ambient;
    forming an amorphous carbon material layer above said interlayer dielectric material by performing a second chemical vapor deposition process;
    forming at least one opening in said amorphous carbon material layer by using a resist mask to form a patterned carbon hard mask; and
    etching said interlayer dielectric material by using said patterned carbon hard mask as an etch mask.

14. The method of claim 13, further comprising forming an adhesion material layer above said interlayer dielectric material, treating a surface of said adhesion material layer by exposing said surface to said plasma ambient, and forming said amorphous carbon material layer on said treated surface.

15. The method of claim 14, wherein forming said adhesion layer comprises performing a third chemical vapor deposition process to form one of a silicon dioxide material using a precursor gas comprising silane and a carbon-doped oxide material layer using a precursor gas comprising carbon and silicon.

16. The method of claim 14, wherein forming said adhesion layer comprises establishing a deposition ambient at a pressure of approximately 2-6 Torr and at a temperature of approximately 350-500° C.

17. The method of claim 14, wherein forming said adhesion layer comprises forming a material layer having a thickness in a range of approximately 5-10 nm.

18. The method of claim 13, wherein exposing said semiconductor device to said plasma ambient treating a surface of said interlayer dielectric material by exposing said surface to said plasma ambient, and forming said amorphous carbon material layer on said interlayer dielectric material.

* * * * *